(12) United States Patent
Komori et al.

(10) Patent No.: US 9,466,611 B2
(45) Date of Patent: Oct. 11, 2016

(54) INTEGRATED CIRCUIT DEVICE AND METHOD FOR MANUFACTURING THE SAME

(71) Applicant: Kabushiki Kaisha Toshiba, Minato-ku (JP)

(72) Inventors: Yosuke Komori, Yokohama (JP); Yasuyoshi Hyodo, Ota (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/812,376

(22) Filed: Jul. 29, 2015

(65) Prior Publication Data

US 2016/0079270 A1    Mar. 17, 2016

(30) Foreign Application Priority Data

Sep. 16, 2014 (JP) .................. 2014-187561

(51) Int. Cl.
| | | |
|---|---|---|
| H01L 27/115 | (2006.01) | |
| H01L 21/28 | (2006.01) | |
| H01L 21/3213 | (2006.01) | |
| H01L 21/3205 | (2006.01) | |

(52) U.S. Cl.
CPC ... H01L 27/11582 (2013.01); H01L 21/28282 (2013.01); H01L 21/32053 (2013.01); H01L 21/32134 (2013.01); H01L 27/11551 (2013.01); H01L 27/11556 (2013.01)

(58) Field of Classification Search
CPC ............... H01L 27/11551; H01L 27/11556; H01L 27/11582
See application file for complete search history.

(56) References Cited

U.S. PATENT DOCUMENTS

| | | |
|---|---|---|
| 7,936,004 B2 | 5/2011 | Kito et al. |
| 8,134,203 B2 | 3/2012 | Izumida et al. |
| 8,273,628 B2 | 9/2012 | Yahashi |
| 8,372,720 B2 | 2/2013 | Fukuzumi et al. |
| 8,551,838 B2 | 10/2013 | Kito et al. |
| 8,569,826 B2 | 10/2013 | Kidoh et al. |
| 8,729,624 B2 | 5/2014 | Fukuzumi et al. |
| 8,890,235 B2 | 11/2014 | Kidoh et al. |
| 9,035,374 B2 | 5/2015 | Fukuzumi et al. |
| 9,064,735 B2 | 6/2015 | Kito et al. |
| 2007/0252201 A1 | 11/2007 | Kito et al. |
| 2010/0207195 A1 | 8/2010 | Fukuzumi et al. |
| 2011/0031550 A1 | 2/2011 | Komori et al. |
| 2011/0284947 A1 | 11/2011 | Kito et al. |
| 2011/0287597 A1 | 11/2011 | Kito et al. |
| 2011/0309431 A1 | 12/2011 | Kidoh et al. |
| 2013/0126961 A1 | 5/2013 | Fukuzumi et al. |
| 2014/0021531 A1 | 1/2014 | Kidoh et al. |
| 2014/0217493 A1 | 8/2014 | Fukuzumi et al. |
| 2015/0200204 A1 | 7/2015 | Fukuzumi et al. |

Primary Examiner — Amar Movva
(74) Attorney, Agent, or Firm — Oblon, McClelland, Maier & Neustadt, L.L.P.

(57) ABSTRACT

An integrated circuit device according to one embodiment includes a plurality of first electrode films stacked spaced from each other, a plurality of second electrode films stacked spaced from each other on the plurality of first electrode films and extending in one direction, a semiconductor pillar penetrating the first electrode films and the second electrode films, a memory film provided between the first electrode films and the semiconductor pillar and capable of storing charge, a gate insulating film provided between the second electrode films and the semiconductor pillar, and a spacer film electrically connecting width-direction edges of the plurality of second electrode films to each other.

10 Claims, 18 Drawing Sheets

US 9,466,611 B2

INTEGRATED CIRCUIT DEVICE AND METHOD FOR MANUFACTURING THE SAME

CROSS-REFERENCE TO RELATED APPLICATIONS

This application is based upon and claims the benefit of priority from Japanese Patent Application No.2014-187561, filed on Sep. 16, 2014; the entire contents of which are incorporated herein by reference.

FIELD

Embodiments described herein relate to an integrated circuit device and a method for manufacturing the same.

BACKGROUND

Non-volatile semiconductor memory devices, particularly flash memories, are used in various applications, and a further increase in capacity is demanded. For this reason, the miniaturization has advanced at an accelerated rate, and therefore, the processing is approaching its limit. In a structure in which memory cells, circuit elements, and the like are disposed on a plane as in the current structure, the increase in capacity has to be achieved only by miniaturization, but the miniaturization has also its limit. As a means of solving this problem, a flash memory having a three-dimensional structure has been recently proposed in which the memory structure including the memory cells and select gates disposed on the plane is arranged in the vertical direction.

DETAILED DESCRIPTION

An integrated circuit device according to one embodiment includes a plurality of first electrode films stacked spaced from each other, a plurality of second electrode films stacked spaced from each other on the plurality of first electrode films and extending in one direction, a semiconductor pillar penetrating the first electrode films and the second electrode films, a memory film provided between the first electrode films and the semiconductor pillar and capable of storing charge, a gate insulating film provided between the second electrode films and the semiconductor pillar, and a spacer film electrically connecting width-direction edges of the plurality of second electrode films to each other.

A method for manufacturing an integrated circuit device includes forming a first stacked body by alternately stacking first electrode films and first insulating films. The method includes forming a first memory hole in the first stacked body, the first memory hole extends in a stacking direction of the first electrode films and the first insulating films; The method includes forming a memory film capable of storing charge on an inner surface of the first memory hole. The method includes embedding a first semiconductor pillar in the first memory hole. The method includes forming a first slit extending in one direction in the first stacked body. The method includes embedding a first material in the first slit. The method includes forming a second stacked body on the first stacked body by alternately stacking second electrode films and second insulating films. The method includes forming a second memory hole extending in the stacking direction in the second stacked body. The second memory hole communicates with the first memory hole. The method includes forming a third insulating film on an inner surface of the second memory hole. The method includes embedding a second semiconductor pillar in the second memory hole. The method includes forming a second slit extending in the one direction in the second stacked body. The second slit communicates with the first slit. The method includes depositing a conductive material on an inner surface of the second slit. The method includes removing a portion of the conductive material deposited on a bottom surface of the second slit. The method includes removing the first material by applying etching through the second slit. The method includes embedding an insulating member in the first slit and the second slit.

First Embodiment

First, a first embodiment will be described.

Figure 1:
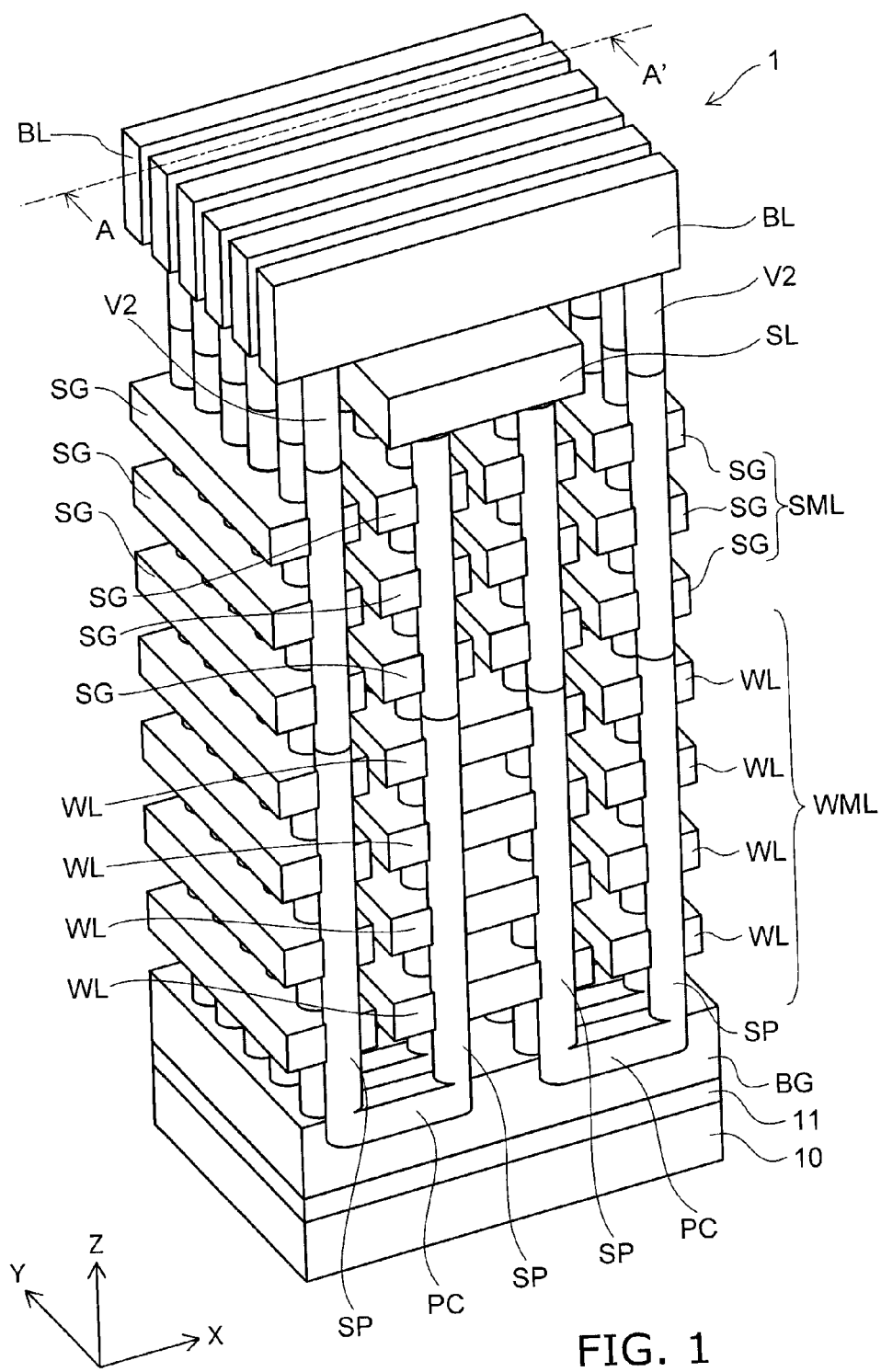
FIG. 1 is a perspective view illustrating an integrated circuit device according to a first embodiment.

FIG. 1 is a perspective view illustrating an integrated circuit device according to the embodiment.

Figure 2:
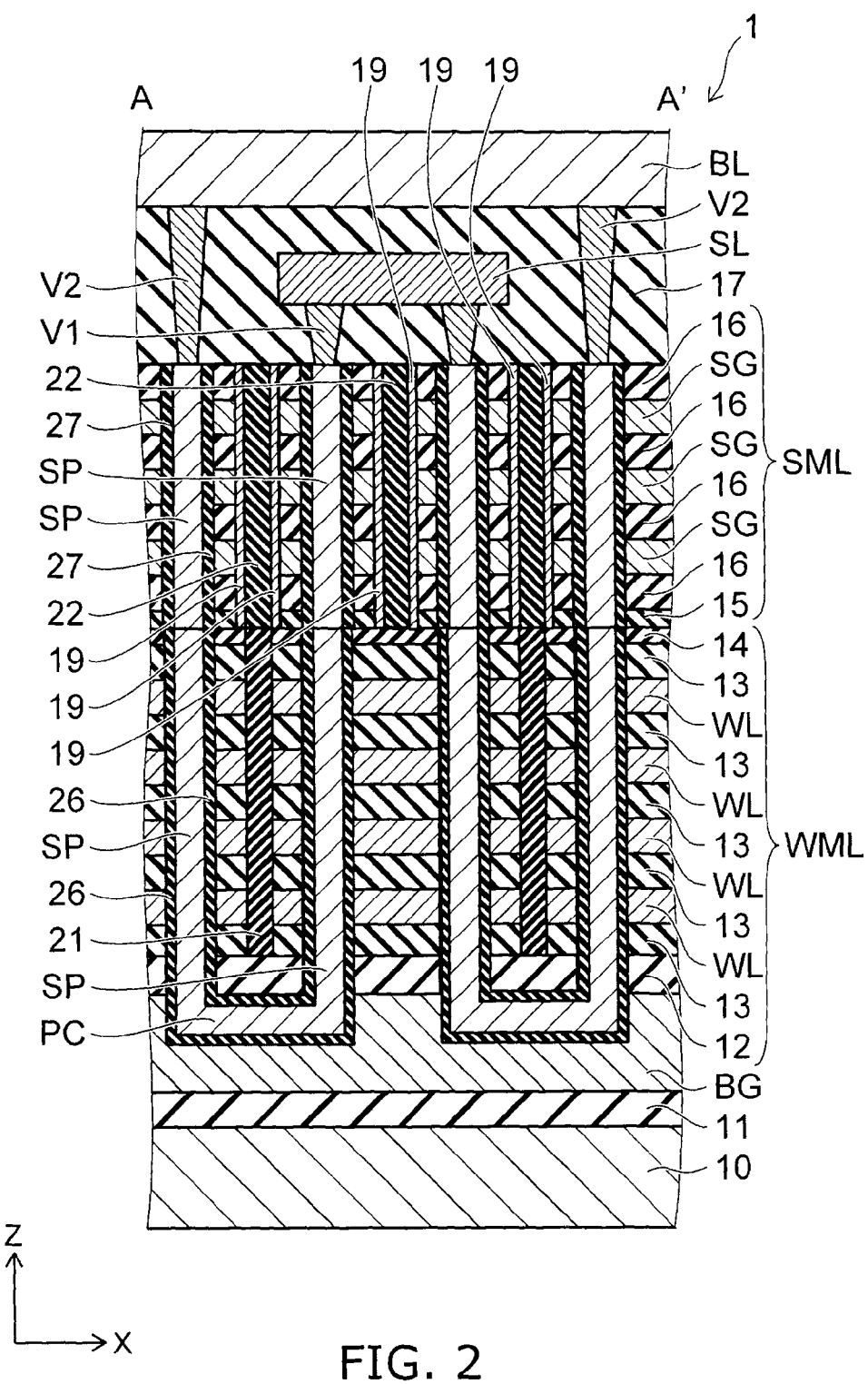
FIG. 2 is a cross-sectional view taken along the line A-A' in FIG. 1.

FIG. 2 is a cross-sectional view taken along the line A-A' in FIG. 1.

Figure 3A:
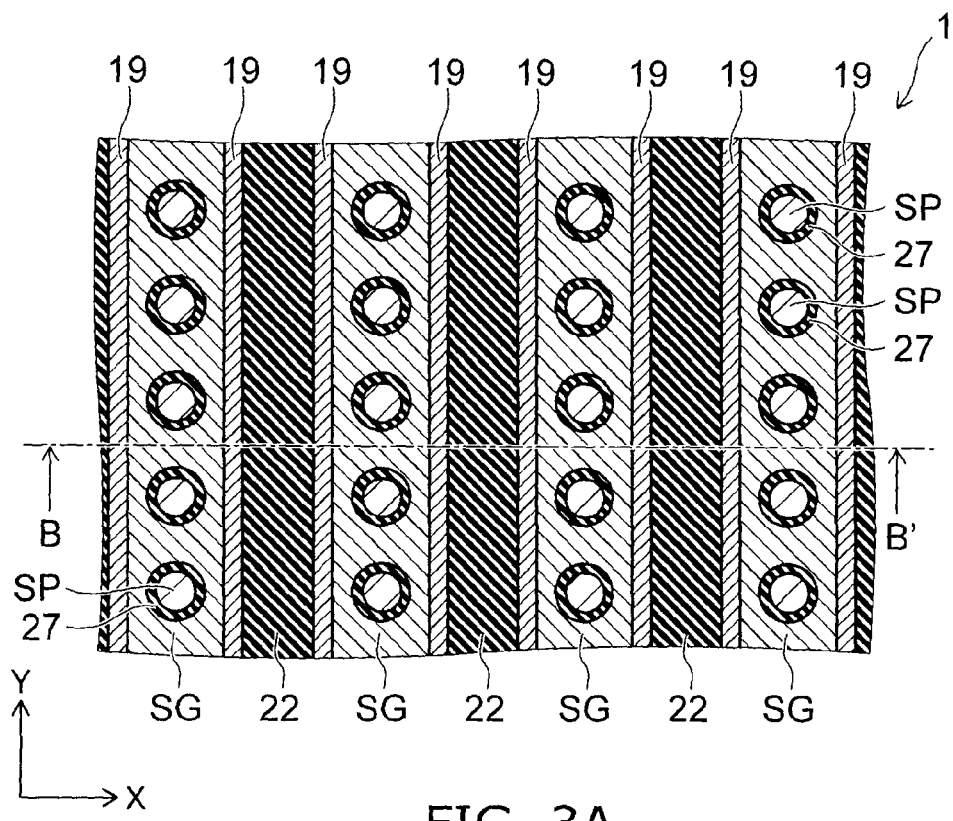
FIG. 3A is a cross-sectional view illustrating the integrated circuit device according to the first embodiment.
Figure 3B:
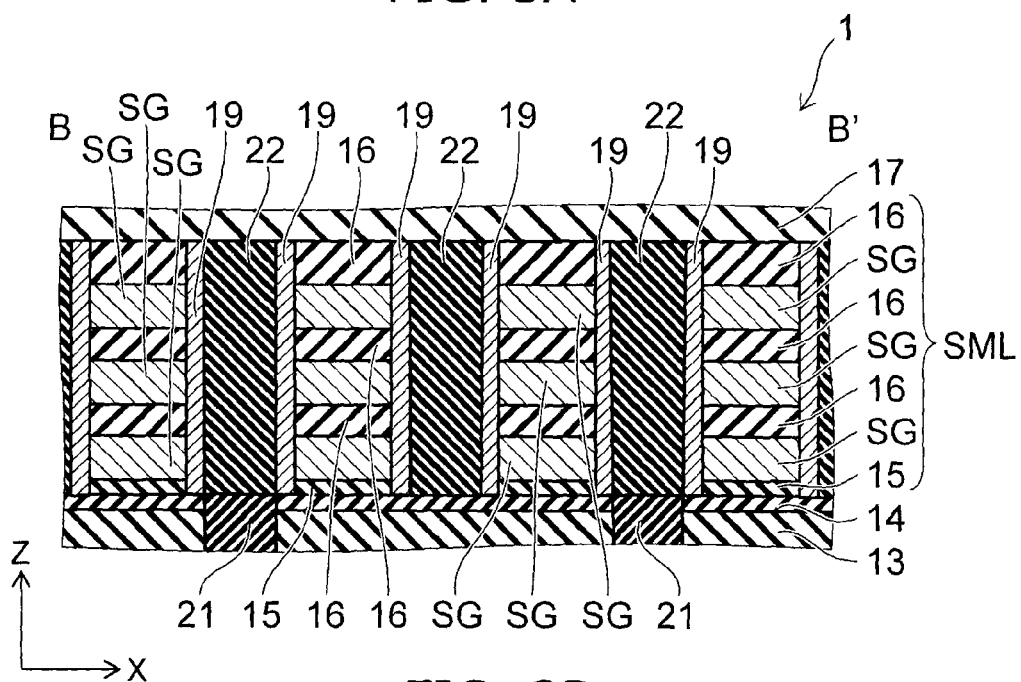
FIG. 3B is a cross-sectional view taken along the line B-B' in FIG. 3A.

FIG. 3A is a cross-sectional view illustrating the integrated circuit device according to the embodiment; and FIG. 3B is a cross-sectional view taken along the line B-B' in FIG. 3A.

In FIG. 1, for convenience of illustration, conductive members are mainly shown, while some of insulative members are omitted. Moreover, as will be described later, illustration of spacer films is omitted. FIGS. 3A and 3B show select gate electrode films and their surroundings.

The integrated circuit device according to the embodiment is a stacked non-volatile semiconductor memory device.

As shown in FIG. 1 and FIG. 2, a silicon substrate 10 is provided in the integrated circuit device 1 according to the embodiment.

Hereinafter, an XYZ orthogonal coordinate system is employed for convenience of description in the specification. Two directions parallel to an upper surface of the silicon substrate 10 and orthogonal to each other are defined as an "X-direction" and a "Y-direction", and a direction vertical to the upper surface of the silicon substrate 10, that is, the up-and-down direction is defined as a "Z-direction".

An insulating film 11 and a back gate electrode BG are provided on the silicon substrate 10. The back gate electrode BG has a plate-like shape extending in an XY plane. Substantially rectangular parallelepiped pipe connectors PC whose longitudinal direction is the X-direction are provided in the back gate electrode BG. A stopper insulating film 12 is provided on the back gate electrode BG. On the stopper insulating film 12, a plurality of layers of inter-layer insulating films 13 and a plurality of layers of control gate electrode films WL are alternately stacked. A stopper insulating film 14 is provided on the alternately stacked inter-layer insulating films 13 and control gate electrode films WL.

The stopper insulating film 12, the alternately stacked inter-layer insulating films 13 and control gate electrode films WL, and the stopper insulating film 14 configure a control gate stacked body WML. Each of the control gate electrode films WL is divided by plate-like insulating members 21 extending in an YZ plane into belt-like members extending in the Y-direction. That is, the plurality of control gate electrode films WL each extend in the Y-direction and are arranged spaced from each other along the X-direction and the Z-direction in the control gate stacked body WML.

A stopper insulating film 15 is provided on the control gate stacked body WML. On the stopper insulating film 15, a plurality of layers of inter-layer insulating films 16 and a plurality of layers of select gate electrode films SG are alternately stacked. The stopper insulating film 15 and the alternately stacked inter-layer insulating films 16 and select gate electrode films SG configure a select gate stacked body SML. Each of the select gate electrode films SG is divided by plate-like insulating members 22 extending in the YZ plane into belt-like members extending in the Y-direction.

The arrangement pitch of the insulating members 22 in the X-direction is one-half the arrangement pitch of the insulating members 21, and every other insulating member 22 is located in a region directly on the insulating member 21. For this reason, the width of the select gate electrode film SG is narrower than the width of the control gate electrode film WL, and the sum of widths of two select gate electrode films SG and one insulating member 22 therebetween is equal to the width of one control gate electrode film WL. Moreover, the film thickness and composition of the select gate electrode film SG are substantially equal to the film thickness and composition of the control gate electrode film WL, and the film thickness and composition of the inter-layer insulating film 16 are substantially equal to the film thickness and composition of the inter-layer insulating film 13.

As shown in FIG. 2 and FIGS. 3A and 3B, width-direction (X-direction) edges of the plurality of select gate electrode films SG arranged along the Z-direction are connected to each other by means of a conductive spacer film 19 extending along the YZ plane. Due to this, the plurality of layers of select gate electrode films SG stacked spaced from each other along the Z-direction are connected to each other through two spacer films 19 provided at both width-direction edges of the select gate electrode films SG. In FIG. 1, the spacer films 19 are omitted for convenience of illustration.

A source line SL extending in the Y-direction is provided above the select gate electrode film SG. The width of the source line SL is substantially equal to the width of the control gate electrode film WL. Bit lines BL extending in the X-direction are provided above the source line SL. An inter-layer insulating film 17 is provided so as to cover the source line SL and the bit lines BL.

Moreover, silicon pillars SP extending in the Z-direction are provided between the back gate electrode BG and the source line SL and between the back gate electrode BG and the bit lines BL so as to penetrate the control gate stacked body WML and the select gate stacked body SML. The silicon pillars SP are arranged in a matrix along the X-direction and the Y-direction. Lower ends of two silicon pillars SP next to each other in the X-direction are connected to each other through the pipe connector PC. One silicon pillar SP of the two silicon pillars SP (hereinafter also referred to as "pillar pair") connected to each other through the pipe connector PC is connected to the source line SL through a via V1, while the other silicon pillar SP is connected to the bit line BL through a via V2.

The insulating member 21 is disposed so as to pass through a region directly above an X-direction central portion of the pipe connector PC. Therefore, in the X-direction, the pipe connector PC and the control gate electrode film WL have the same arrangement pitch but are shifted in phase from each other by one-half the pitch. For this reason, silicon pillars SP in two rows extending in the Y-direction penetrate each of the control gate electrode films WL, and two silicon pillars SP belonging to the same pillar pair penetrate different control gate electrode films WL.

Moreover, as described above, the arrangement pitch of the select gate electrode films SG in the X-direction is one-half the arrangement pitch of the control gate electrode films WL. For this reason, silicon pillars SP in one row extending in the Y-direction penetrate the same select gate electrode film SG, and silicon pillars SP belonging to a different row penetrate a different select gate electrode film SG.

Further, two rows of silicon pillars SP penetrating a certain control gate electrode film WL are connected to the same source line SL. Two rows of silicon pillars SP penetrating control gate electrode films WL next to the certain control gate electrode film WL are connected to the bit lines BL. Of the silicon pillars SP connected to the bit lines BL, the silicon pillars SP arranged in one row along the X-direction are connected to the same bit line BL, while the silicon pillars SP arranged along the Y-direction are connected to different bit lines BL.

A memory film 26 capable of storing charge is provided on an outer surface of a structure composed of the pipe connector PC and portions of the silicon pillars SP disposed in the control gate stacked body WML. In the memory film 26, a tunnel insulating layer (not shown), a charge storage layer (not shown), and a block insulating layer (not shown) are stacked in this order from the silicon pillar SP side. The tunnel insulating layer is a layer that is usually insulative but allows an FN tunnel current to flow therethrough in response to the application of a predetermined voltage within the range of drive voltage of the integrated circuit device 1. The tunnel insulating layer is, for example, a silicon oxide layer or an ONO (oxide-nitride-oxide) layer. The charge storage layer is a layer having the ability to store charge. The charge storage layer is formed of, for example, a material having electron trap sites, and formed of, for example, silicon nitride. The block insulating layer is a layer that does not substantially allow a current to flow therethrough even with the application of a voltage within the range of drive voltage of the integrated circuit device 1. The block insulating layer is, for example, a silicon oxide layer or a multi-layered film including a silicon oxide layer and a high permittivity layer.

The high permittivity layer is, for example, an aluminum oxide layer or a hafnium oxide layer. Due to this, a memory cell transistor is formed at each of intersecting portions between the silicon pillar SP and the control gate electrode films WL.

Moreover, a gate insulating film 27 is provided on an outer surface of a portion of the silicon pillar SP disposed in the select gate stacked body SML. The film structure of the gate insulating film 27 may be the same as or different from the film structure of the memory film 26. The gate insulating film 27 may be, for example, an ONO film or a single layer of silicon oxide film. Due to this, a select transistor is formed at each of intersecting portions between the silicon pillar SP and the select gate electrode films SG.

The back gate electrode BG, the control gate electrode film WL, the select gate electrode film SG, and the spacer film 19 are formed of a conductive material, for example, impurity-introduced polysilicon. The insulating film 11, the inter-layer insulating films 13, 16, and 17, and the insulating members 21 and 22 are formed of an insulative material, for example, silicon oxide. The stopper insulating films 12, 14, and 15 are formed of an insulative material different from that of the inter-layer insulating film, for example, silicon nitride. The silicon pillar SP and the pipe connector PC are formed of a semiconductor material, and formed of, for example, polysilicon. The vias V1 and V2, the source line SL, and the bit line BL are formed of a conductive material, for example, metal.

Next, a method of manufacturing the integrated circuit device according to the embodiment will be described.

FIGS. 4A and 4B, FIGS. 5A and 5B, and FIG. 6 to FIG. 11 are process cross-sectional views illustrating the method of manufacturing the integrated circuit device according to the embodiment.

Figure 4A:
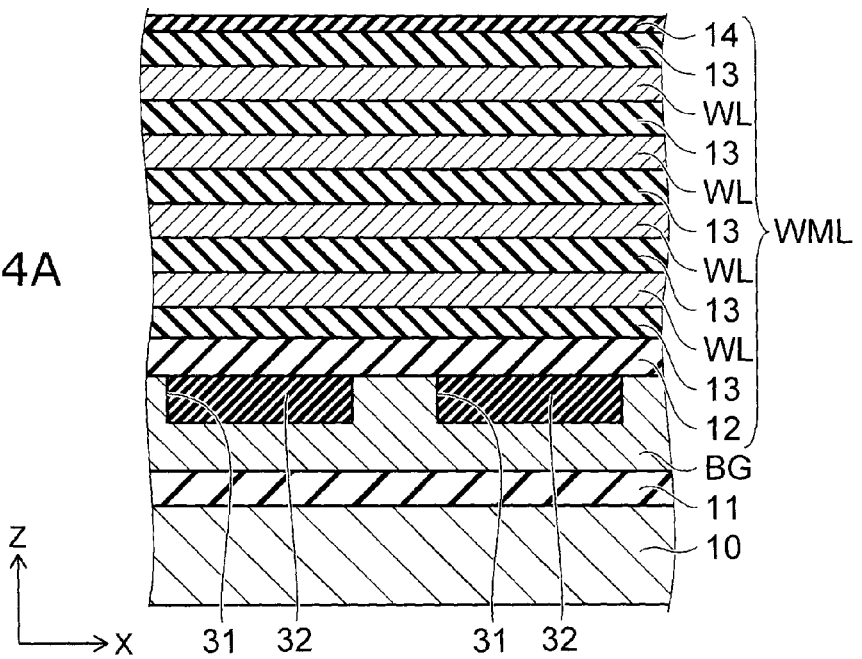
FIGS. 4A to 11 are process cross-sectional views illustrating a method of manufacturing the integrated circuit device according to the first embodiment.

First, as shown in FIG. 4A, the insulating film 11 is formed on the silicon substrate 10, and the back gate electrode BG is formed on the insulating film 11. Next, substantially rectangular parallelepiped recesses 31 whose longitudinal direction is the X-direction are formed in a matrix in an upper surface of the back gate electrode BG, and a sacrificial member 32 is embedded in the recesses 31. For example, when the back gate electrode BG is formed of polysilicon, the sacrificial member 32 can be formed of silicon nitride. Next, the stopper insulating film 12 is formed, and the inter-layer insulating films 13 and the control gate electrode films WL are alternately stacked on the stopper insulating film 12. Next, the stopper insulating film 14 is formed. The control gate stacked body WML is fabricated with the stopper insulating film 12, the inter-layer insulating films 13, the control gate electrode films WL, and the stopper insulating film 14.

Figure 4B:
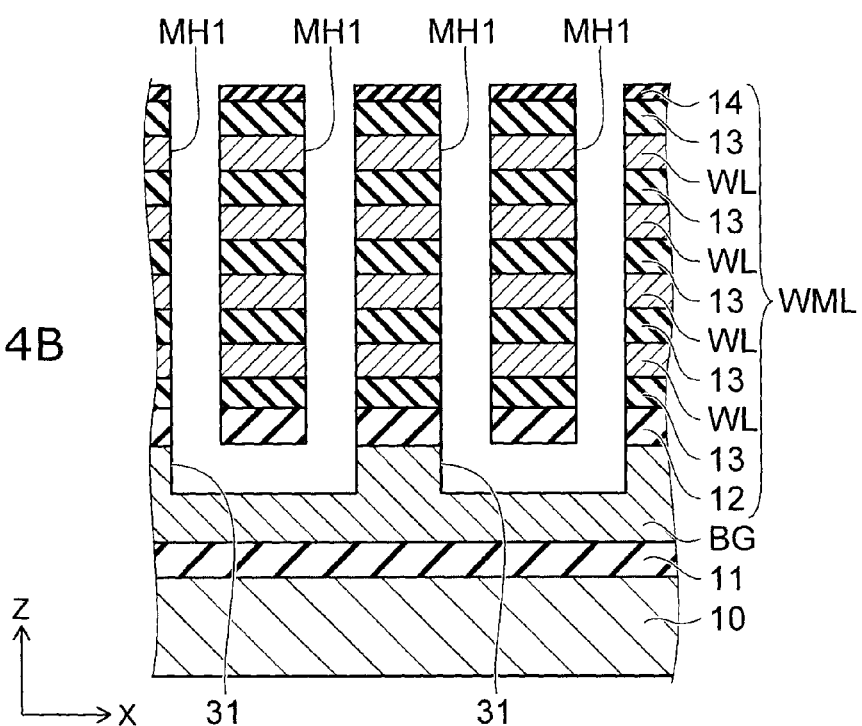

Next, as shown in FIG. 4B, memory holes MH1 extending in the Z-direction are formed in the control gate stacked body WML by a lithography method and a RIE (Reactive Ion Etching) method. The memory holes MH1 are caused to reach both X-direction ends of the recess 31. Next, wet etching using, for example, phosphoric acid ($H_3PO_4$) is applied to remove the sacrificial members 32 in the recesses 31 through the memory holes MH1.

Figure 5A:
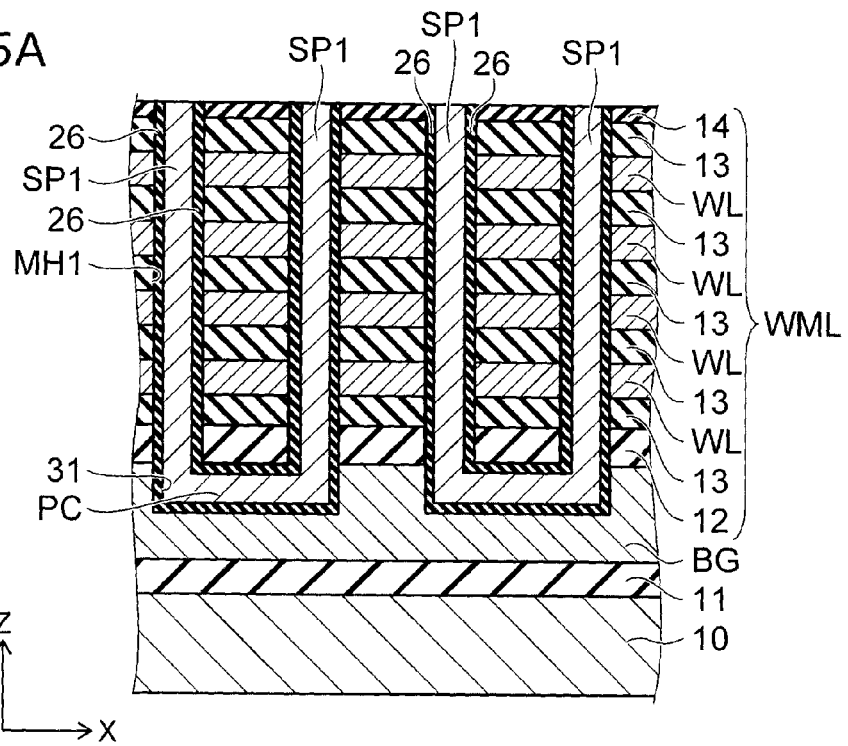

Next, as shown in FIG. 5A, the block insulating layer (not shown), the charge storage layer (not shown), and the tunnel insulating layer (not shown) are formed in this order on inner surfaces of the memory holes MH1 and the recess 31 to form the memory film 26. Next, silicon is embedded in the memory holes MH1 and the recesses 31. Due to this, the pipe connector PC is formed in the recess 31, and at the same time, a lower portion SP1 of the silicon pillar SP is formed in the memory hole MH1.

Figure 5B:
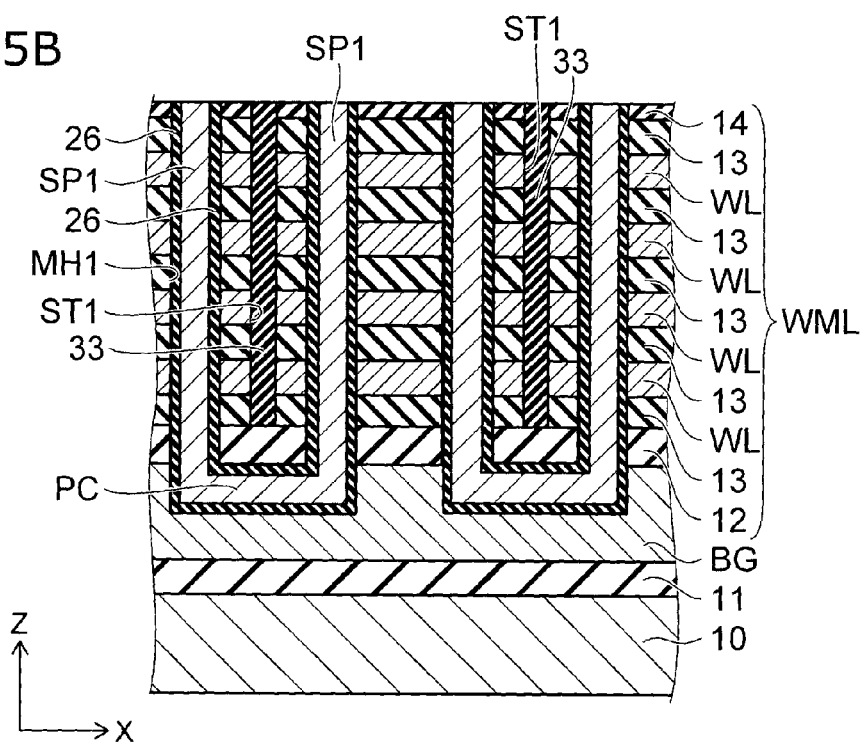

Next, as shown in FIG. 5B, a resist mask (not shown) is formed by a lithography method, and RIE is applied using the stopper insulating film 12 as a stopper, whereby slits ST1 extending in the YZ plane are formed in the control gate stacked body WML. The slit ST1 is formed so as to pass through the region directly above the X-direction central portion of the pipe connector PC. Next, a sacrificial member 33 is embedded in the slits ST1 by depositing, for example, silicon nitride.

Figure 6:
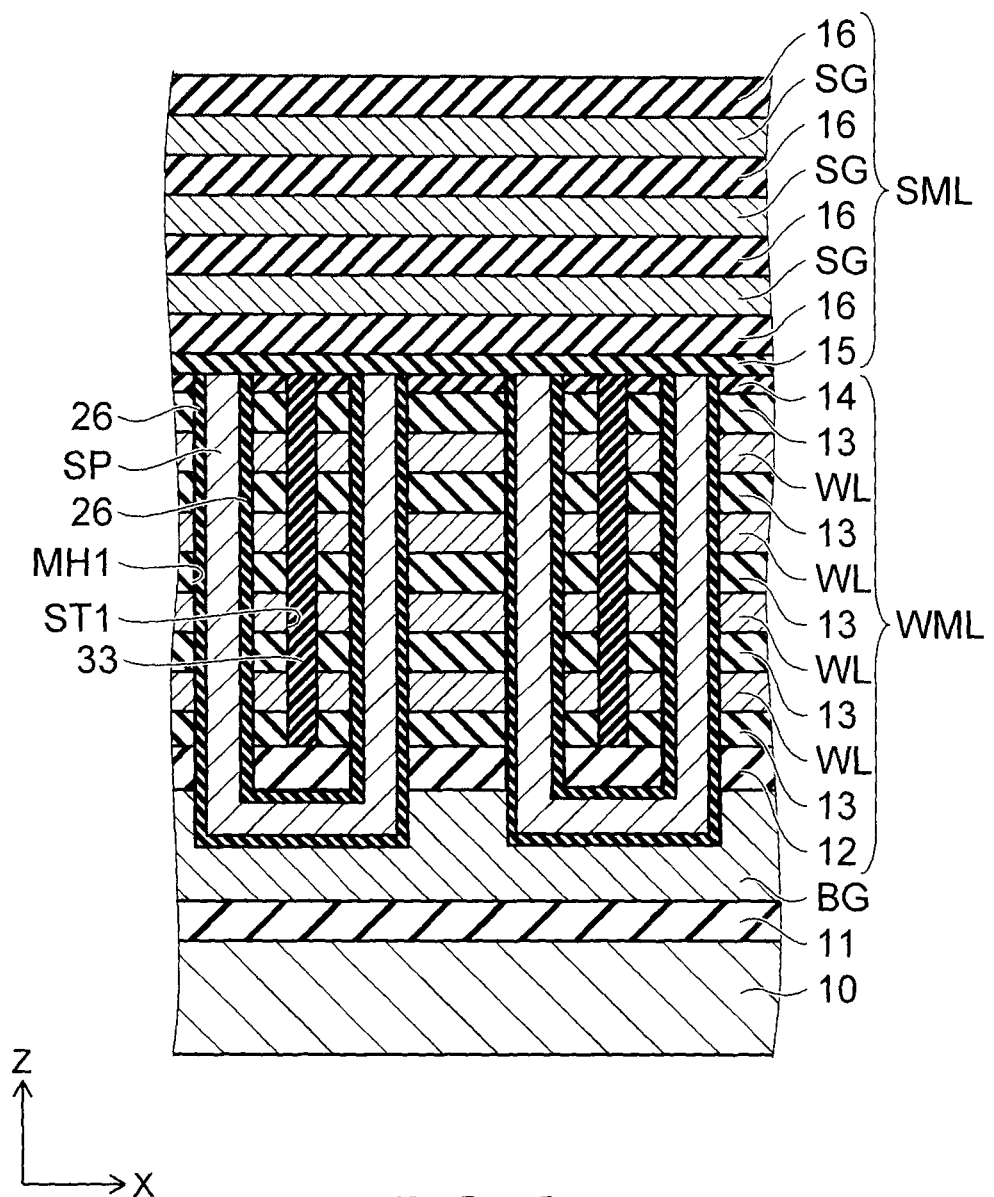

Next, as shown in FIG. 6, the stopper insulating film 15 is formed on the control gate stacked body WML, and the inter-layer insulating films 16 and the select gate electrode films SG are alternately stacked on the stopper insulating film 15. Due to this, the select gate stacked body SML composed of the stopper insulating film 15, the inter-layer insulating films 16, and the select gate electrode films SG is fabricated on the control gate stacked body WML.

Figure 7:
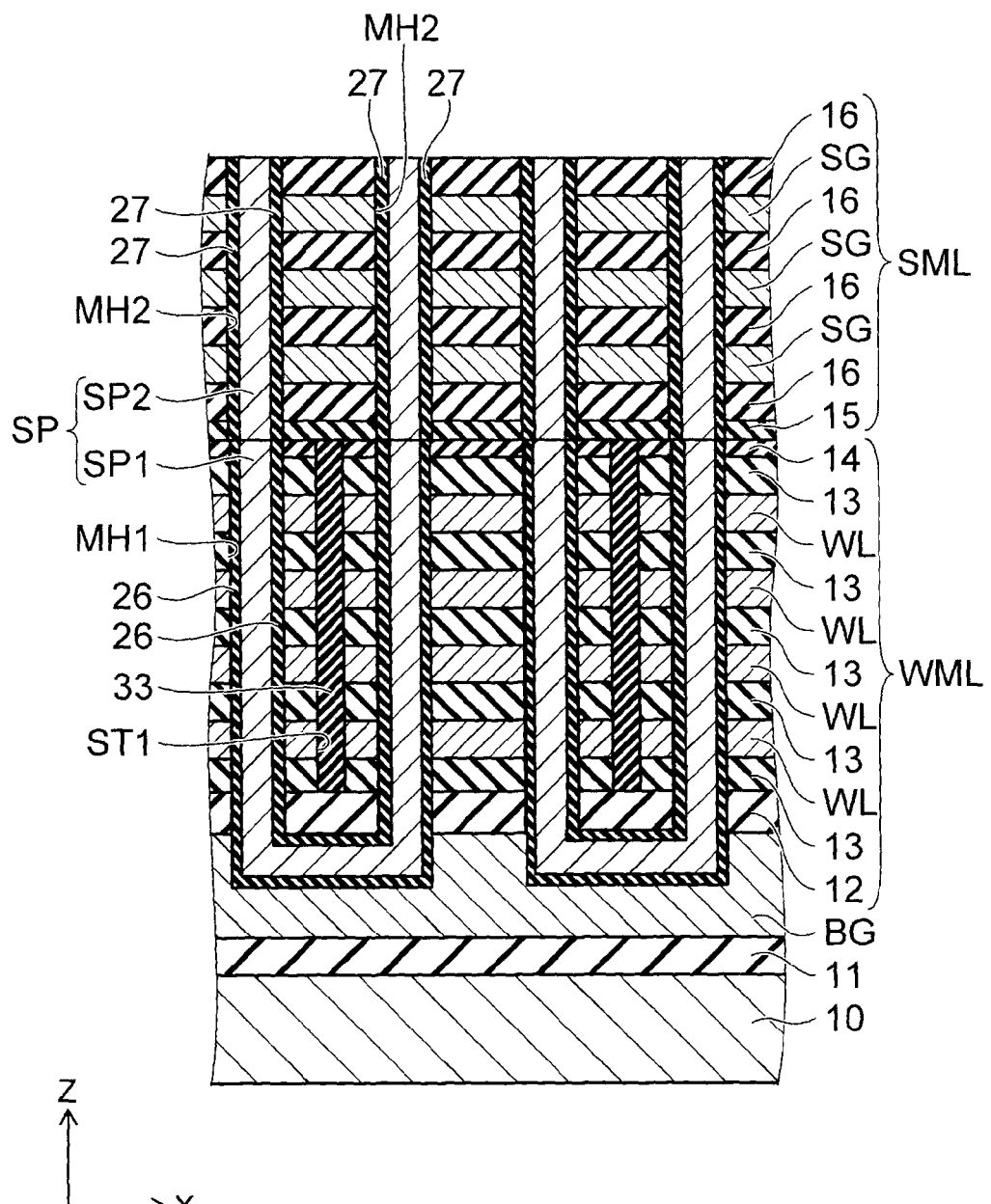

Next, as shown in FIG. 7, a memory hole MH2 is formed in a region directly on each of the memory holes MH1 in the select gate stacked body SML. Next, the gate insulating film 27 is formed on an inner surface of the memory hole MH2. Next, silicon is embedded in the memory hole MH2 to form an upper portion SP2 of the silicon pillar SP. The lower portion SP1 and the upper portion SP2 form the silicon pillar SP penetrating the control gate stacked body WML and the select gate stacked body SML in the Z-direction.

Figure 8:
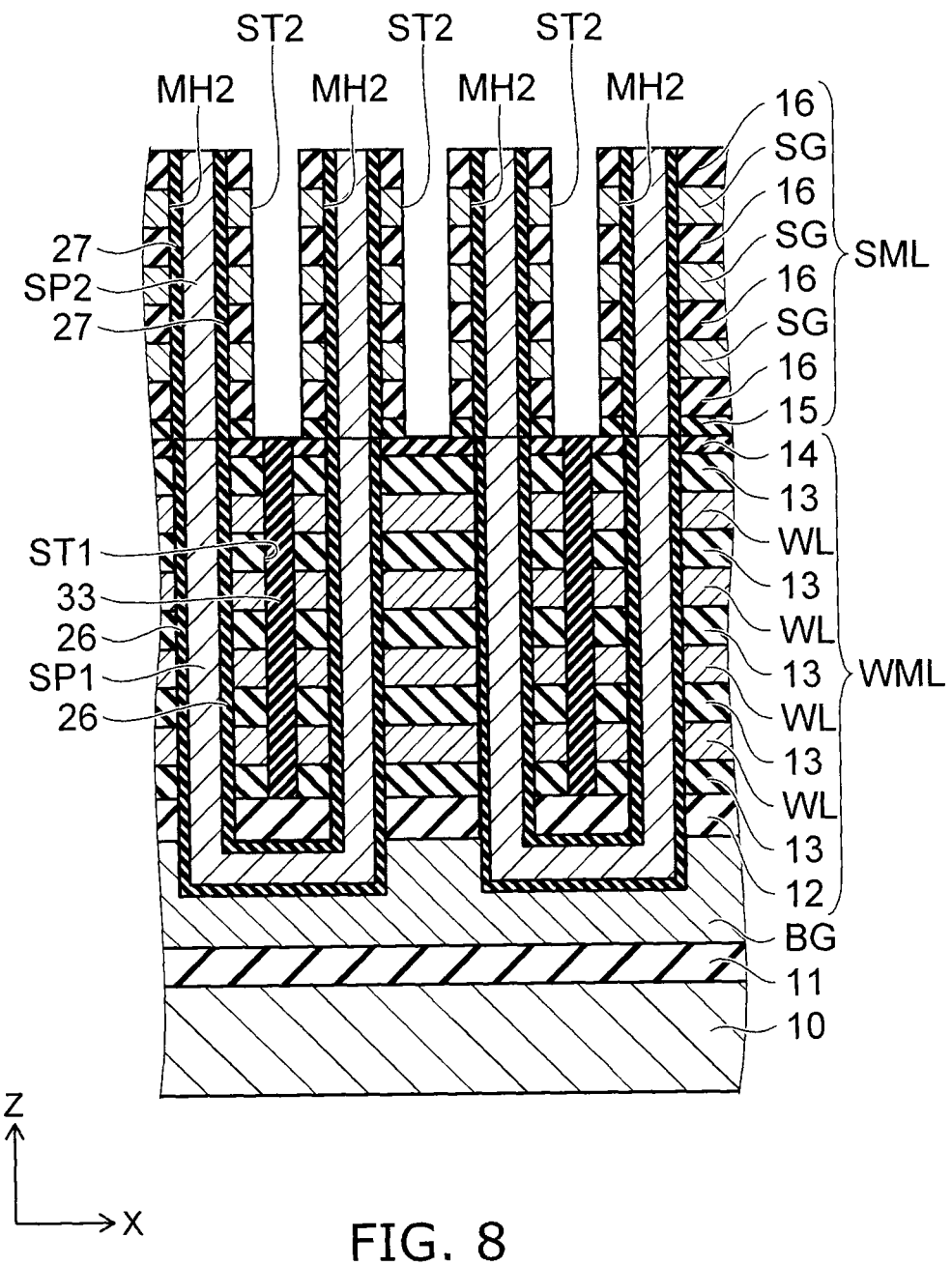

Next, as shown in FIG. 8, a resist mask (not shown) is formed by a lithography method, and RIE is applied using the stopper insulating film 15 as a stopper, whereby slits ST2 extending in the YZ plane are formed in the select gate stacked body SML. The arrangement pitch of the slits ST2 in the X-direction is set to be one-half the arrangement pitch of the slits ST1, and every other slit ST2 is located in a region directly on the slit ST1. Due to this, the slit ST2 is disposed between the memory holes MH2 in the X-direction, and every other slit ST2 communicates with the slit ST1. The select gate electrode films SG are exposed in a side surface of the slit ST2.

Figure 9:
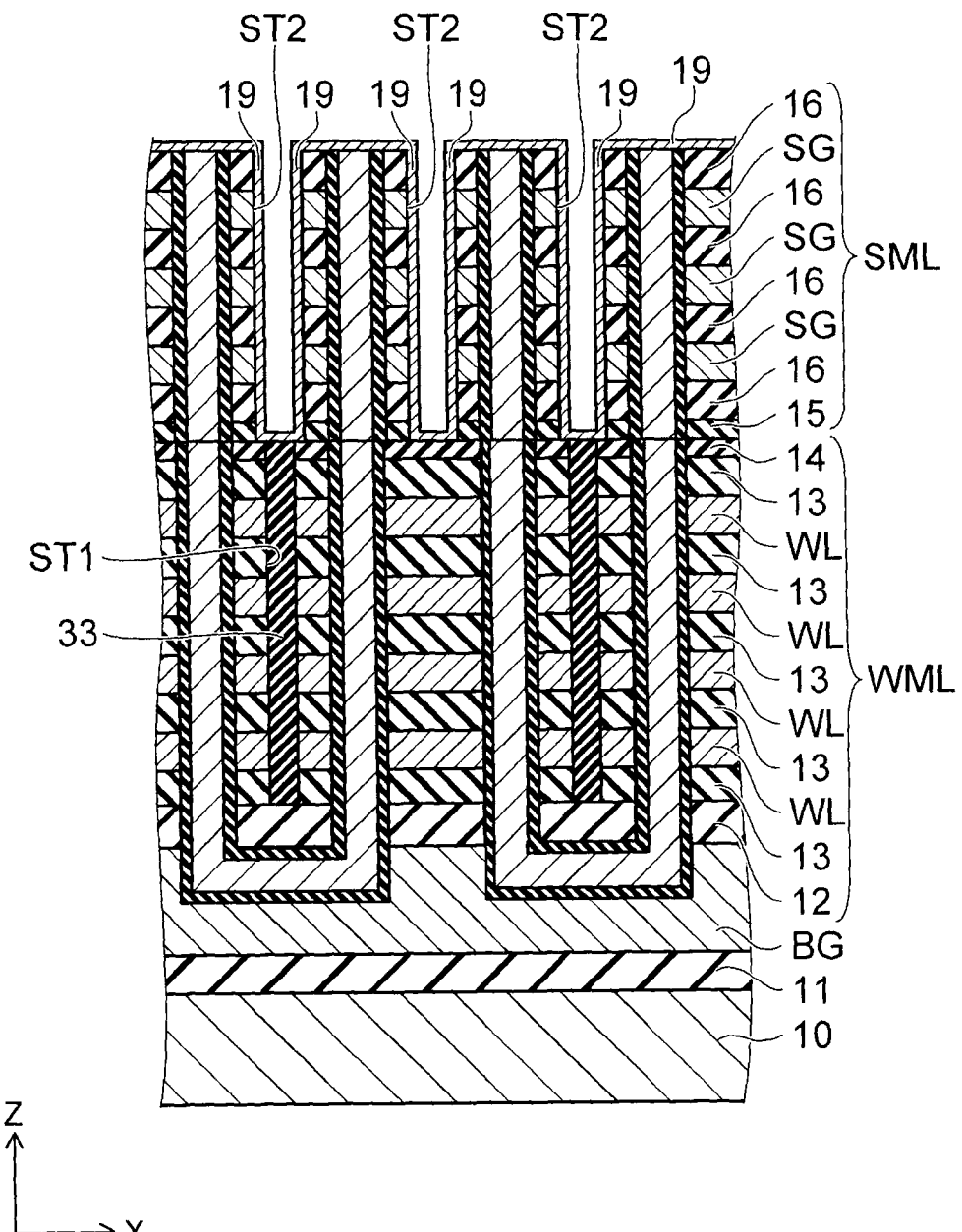

Next, as shown in FIG. 9, the conductive spacer film 19 is formed on an inner surface of the slit ST2 by depositing amorphous silicon by, for example, CVD (Chemical Vapor Deposition). The spacer film 19 contacts the exposed surfaces of the select gate electrode films SG. Due to this, the select gate electrode films SG arranged in the Z-direction are connected to each other through a portion of the spacer film 19 formed on the side surface of the slit ST2, and at the same time, the select gate electrode films SG arranged in the X-direction are connected to each other through a portion of the spacer film 19 formed on a bottom surface of the slit ST2.

Figure 10:
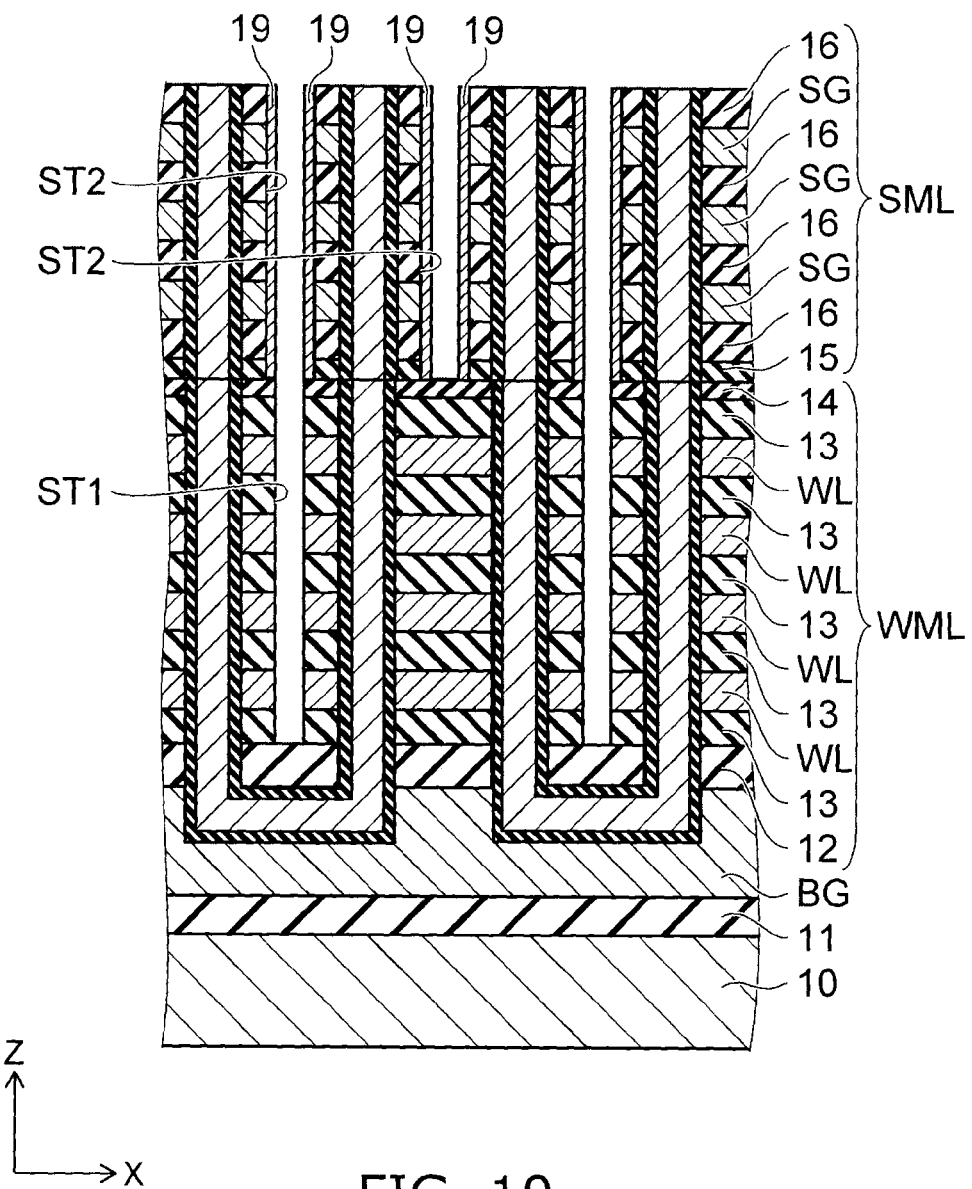

Next, as shown in FIG. 10, RIE is applied to thereby remove the portion of the spacer film 19 formed on the bottom surface of the slit ST2 and a portion of the spacer film 19 formed on an upper surface of the select gate stacked body SML. Due to this, the select gate electrode films SG arranged in the X-direction are insulated from each other, and at the same time, the sacrificial member 33 (refer to FIG. 9) embedded in the slit ST1 is exposed in a bottom surface of the slit ST2. Next, wet etching is applied to thereby remove the sacrificial member 33 through the slit ST2. For example, when the sacrificial member 33 is formed of silicon nitride, phosphoric acid ($H_3PO_4$) can be used as an etchant.

Figure 11:
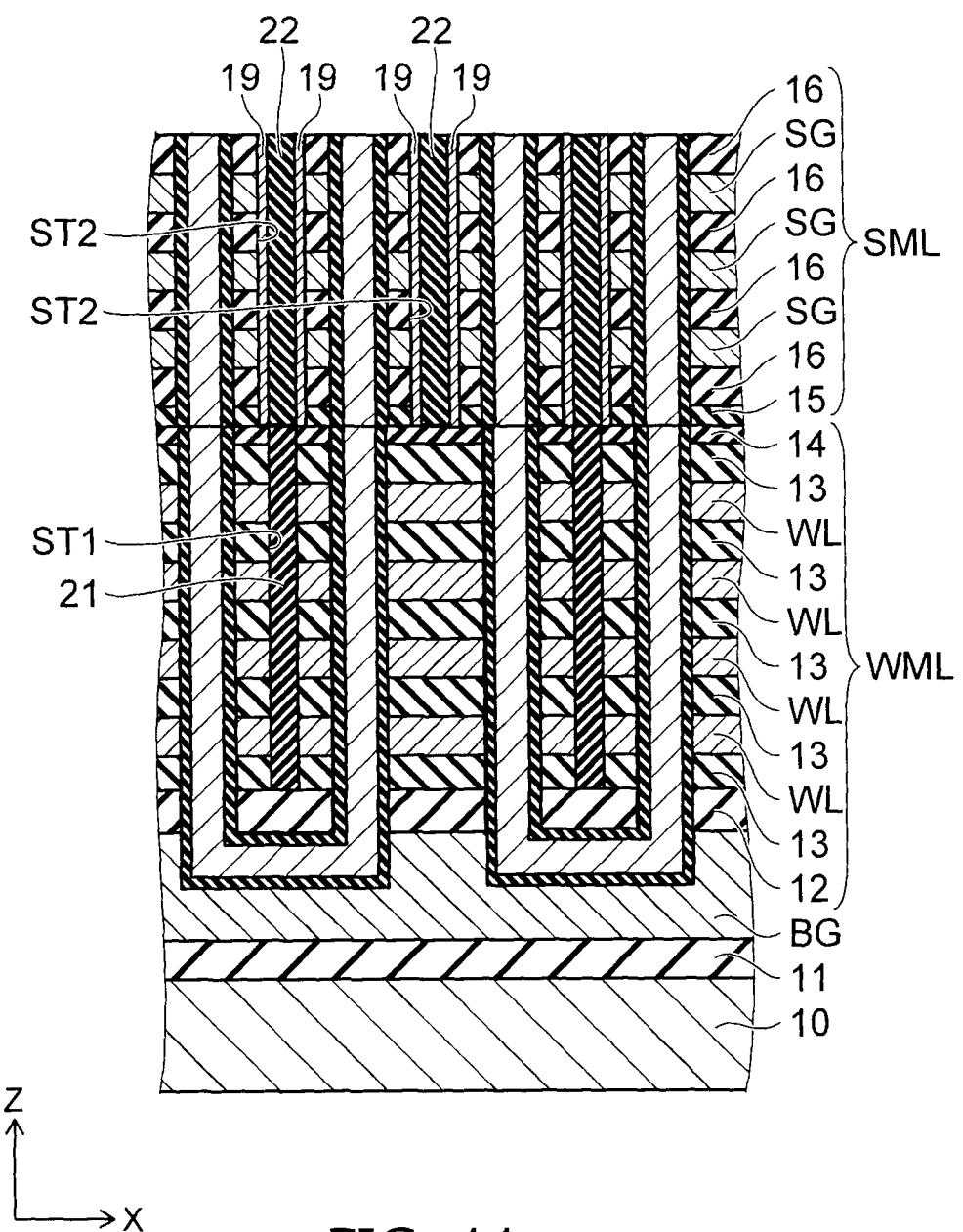

Next, as shown in FIG. 11, silicon oxide, for example, is deposited in the slits ST1 and the slits ST2. Due to this, the insulating member 21 is embedded in the slits ST1, and the insulating member 22 is embedded in the slits ST2.

Next, as shown in FIG. 1 and FIG. 2, the via V1, the source line SL, the via V2, and the bit line BL are formed while forming the inter-layer insulating film 17 in a stepwise manner. In this manner, the integrated circuit device 1 is manufactured.

Next, advantageous effects of the embodiment will be described.

In the embodiment, the film thickness and composition of the select gate electrode film SG are substantially equal to the film thickness and composition of the control gate electrode film WL, and the film thickness and composition of the inter-layer insulating film 16 are substantially equal to the film thickness and composition of the inter-layer insulating film 13. For this reason, processing conditions of the slit ST2 can be made the same as processing conditions of the slit ST1, and processing conditions of the memory hole MH2 can be made the same as processing conditions of the memory hole MH1. Due to this, the integrated circuit device 1 is easily manufactured.

Moreover, in the embodiment, the plurality of select gate electrode films SG arranged in the Z-direction, that is, the plurality of select gate electrode films SG that the same silicon pillar SP penetrates, are connected to each other through the spacer film 19. Due to this, the spacer film 19 functions as a shunt interconnection, so that the plurality of select gate electrode films SG are connected to each other over the entire length in the longitudinal direction thereof (the Y-direction). As a result, a signal applied to the select gate electrode film SG of the uppermost layer can be quickly transmitted to the select gate electrode film SG of the lowermost layer, so that a difference in signal transmission time between the select gate electrode films SG can be reduced. As a result, the integrated circuit device 1 according to the embodiment has a high operating speed.

Further, silicon is deposited on the inner surface of the slit ST2 in the process shown in FIG. 9, and the silicon is removed from the bottom surface of the slit ST2 by RIE in the process shown in FIG. 10, whereby the spacer film 19 can be formed in a self-aligned manner without using a lithography process.

Still further, according to the embodiment, since the side surface of the slit ST2 is covered with the spacer film 19 in the process of removing the sacrificial member 33 (refer to FIG. 9) by wet etching shown in FIG. 10, the inter-layer insulating film 16 and the gate insulating film 27 can be protected against an etchant. Due to this, the inter-layer insulating film 16 and the gate insulating film 27 can be prevented from being damaged by wet etching.

It is also conceivable to provide a dedicated via for connecting the plurality of select gate electrode films SG arranged in the Z-direction to each other. In this case, however, since the select gate electrode films SG are connected to each other only at portions thereof in the longitudinal direction of the select gate electrode film SG, it takes time for a signal applied to the select gate electrode film SG of the uppermost layer to be transmitted to the select gate electrode film SG of the lowermost layer. Especially when the resistance value varies among the select gate electrode films SG, a difference in signal transmission time occurs, making it difficult to collectively control the select gate electrode films SG. Moreover, since dedicated lithography and etching processes are required to form the dedicated via, the manufacturing cost of the integrated circuit device is increased. Further in this case, the inter-layer insulating film 16 and the memory film 26 cannot be protected in the wet etching process shown in FIG. 10.

Second Embodiment

Next, a second embodiment will be described.

Figure 12A:
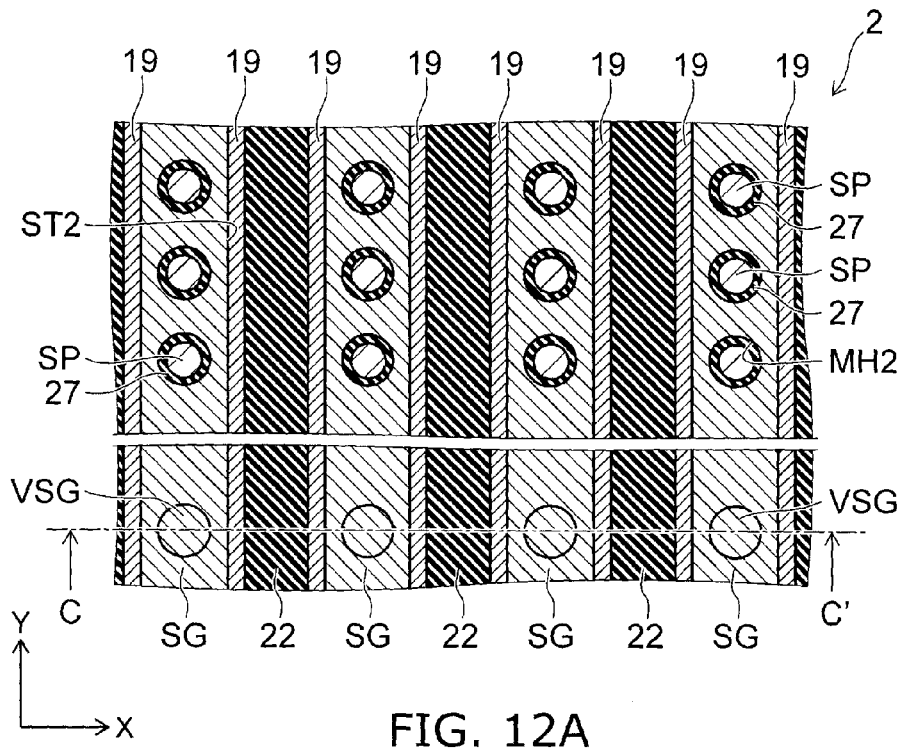
FIG. 12A is a cross-sectional view illustrating an integrated circuit device according to a second embodiment.
Figure 12B:
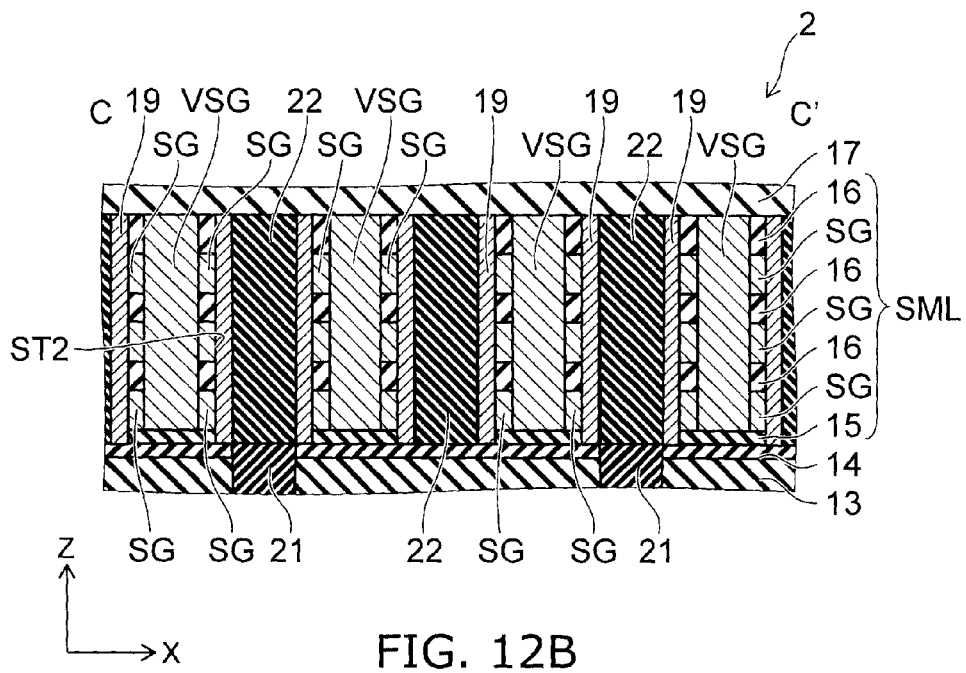
FIG. 12B is a cross-sectional view taken along the line C-C' shown in FIG. 12A.

FIG. 12A is a cross-sectional view illustrating an integrated circuit device according to the embodiment; and FIG. 12B is a cross-sectional view taken along the line C-C' shown in FIG. 12A.

FIGS. 12A and 12B show the select gate electrode films and their surroundings of the integrated circuit device.

As shown in FIGS. 12A and 12B, in the integrated circuit device 2 according to the embodiment, vias VSG that connect the select gate electrode films SG to each other are provided in addition to the spacer films 19. That is, the via VSG is provided so as to penetrate the plurality of layers of select gate electrode films SG arranged in the Z-direction at portions of the select gate electrode films SG in the longitudinal direction (the Y-direction). The via VSG is formed of a conductive material, for example, polysilicon.

Next, a method of manufacturing the integrated circuit device according to the embodiment will be described.

Figure 13A:
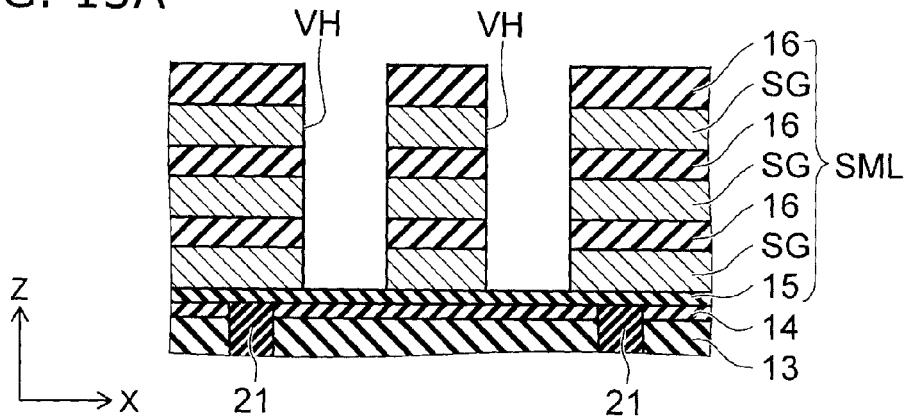
FIGS. 13A to 13C are process cross-sectional views illustrating the method of manufacturing the integrated circuit device according to the second embodiment.
Figure 13B:
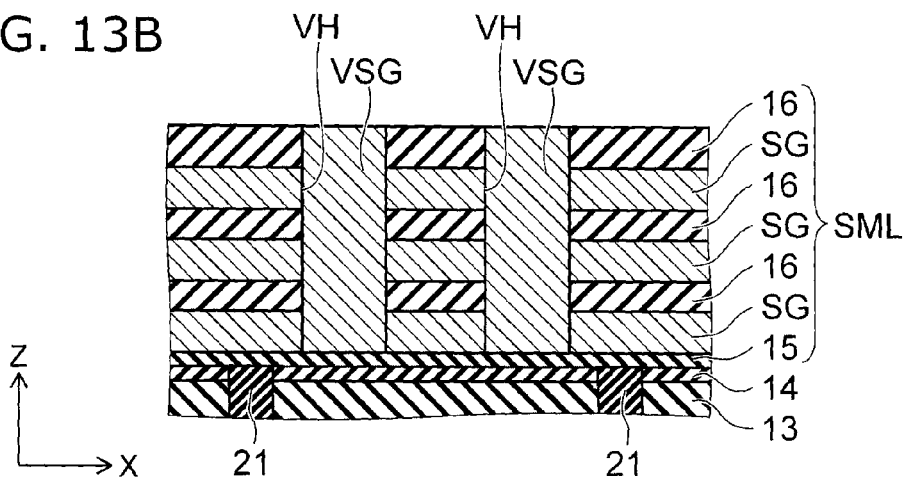
Figure 13C:
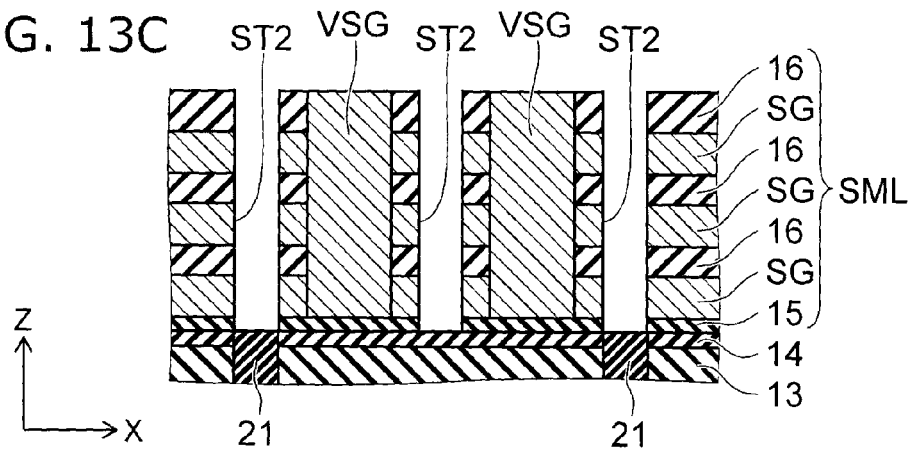

FIGS. 13A to 13C are process cross-sectional views illustrating the method of manufacturing the integrated circuit device according to the embodiment.

First, the processes shown in FIG. 4A to FIG. 7 are carried out. In the embodiment, the lowermost layer of the stacked body composed of the inter-layer insulating films 16 and the select gate electrode films SG is the select gate electrode film SG. The same applies to a third embodiment described later.

Next, as shown in FIG. 13A, a resist mask (not shown) is formed by a lithography method, and RIE is applied using the stopper insulating film 15 as a stopper, whereby via holes VH extending in the Z-direction are formed in the select gate stacked body SML.

Next, as shown in FIG. 13B, amorphous silicon is deposited. Next, the amorphous silicon deposited on an upper surface of the select gate stacked body SML is removed by etching back, while the amorphous silicon deposited in the via hole VH remains. Due to this, the via VSG is formed in the via hole VH. The via VSG is formed in a region in which the memory hole MH2 (refer to FIG. 12A) is not formed in the Y-direction and which is located between regions in each of which the slit ST2 (refer to FIG. 13C) is to be formed in the X-direction.

Next, as shown in FIG. 13C, the slits ST2 extending in the YZ plane are formed in the select gate stacked body SML by applying RIE. The slit ST2 is formed between the vias VSG in the X-direction.

Next, the processes shown in FIG. 9 to FIG. 11 and FIG. 1 are carried out.

In this manner, the integrated circuit device 2 according to the embodiment can be manufactured.

According to the embodiment, the select gate electrode films SG can be connected to each other with a lower resistance by providing the spacer film 19 and the via VSG together. Moreover, the integrated circuit device according to the embodiment can be manufactured only by adding spacer films to a device in which the select gate electrode films SG are connected to each other only through the via VSG.

Configurations, manufacturing methods, and advantageous effects of the embodiment other than those described above are similar to those of the first embodiment.

Third Embodiment

Next, the third embodiment will be described.

Figure 14:
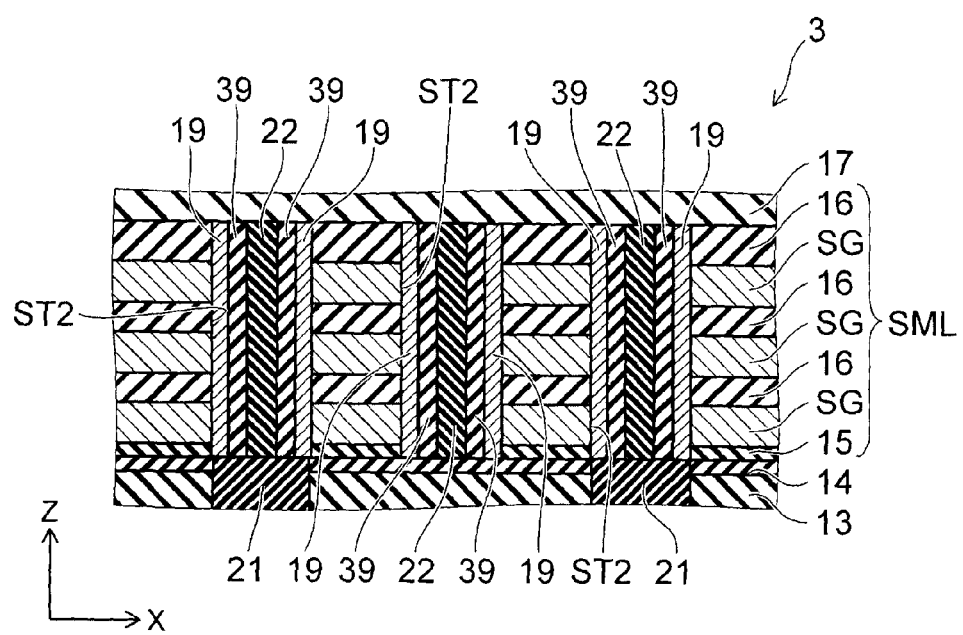
FIG. 14 is a cross-sectional view illustrating an integrated circuit device according to a third embodiment.

FIG. 14 is a cross-sectional view illustrating an integrated circuit device according to the embodiment.

FIG. 14 shows the select gate electrode films and their surroundings of the integrated circuit device.

As shown in FIG. 14, the integrated circuit device 3 according to the embodiment differs from the integrated circuit device 1 according to the first embodiment (refer to FIGS. 3A and 3B) in that a spacer film 39 is provided on a side surface of the spacer film 19. The spacer film 39 is disposed between the spacer film 19 and the insulating member 22. The composition of the spacer film 39 is different from the composition of the spacer film 19. The spacer film 39 is, for example, insulative, and formed of, for example, aluminum oxide ($Al_2O_3$). As described above, the spacer film 19 is formed of, for example, silicon.

Next, a method of manufacturing the integrated circuit device according to the embodiment will be described.

First, the processes shown in FIG. 4A to FIG. 9 are carried out.

Next, aluminum oxide is deposited by, for example, CVD to thereby form the spacer film 39 on the entire surface. Next, anisotropic etching such as RIE is applied to thereby remove a portion of the spacer film 39 deposited on a bottom surface of the slit ST2 and a portion of the spacer film 39 deposited on an upper surface of the select gate stacked body SML. Due to this, the spacer film 39 remains on the side surface of the spacer film 19 in the slit ST2, and at the same time, the sacrificial member 33 (refer to FIG. 9) is exposed in the bottom surface of the slit ST2. Next, wet etching is applied using, for example, phosphoric acid to thereby remove the sacrificial member 33 through the slit ST2.

Next, the processes shown in FIG. 11 and FIG. 1 are carried out. Due to this, the integrated circuit device 3 according to the embodiment can be manufactured.

According to the embodiment, the spacer film 39 made of, for example, aluminum oxide and having high etching resistance is provided on the side surface of the spacer film 19, whereby the inter-layer insulating film 16 and the gate insulating film 27 can be protected more reliably when etching for removing the sacrificial member 33 (refer to FIG. 9) is applied in the process shown in FIG. 10.

Configurations, manufacturing methods, and advantageous effects of the embodiment other than those described above are similar to those of the first embodiment.

Fourth Embodiment

Next, a fourth embodiment will be described.

Figure 15:
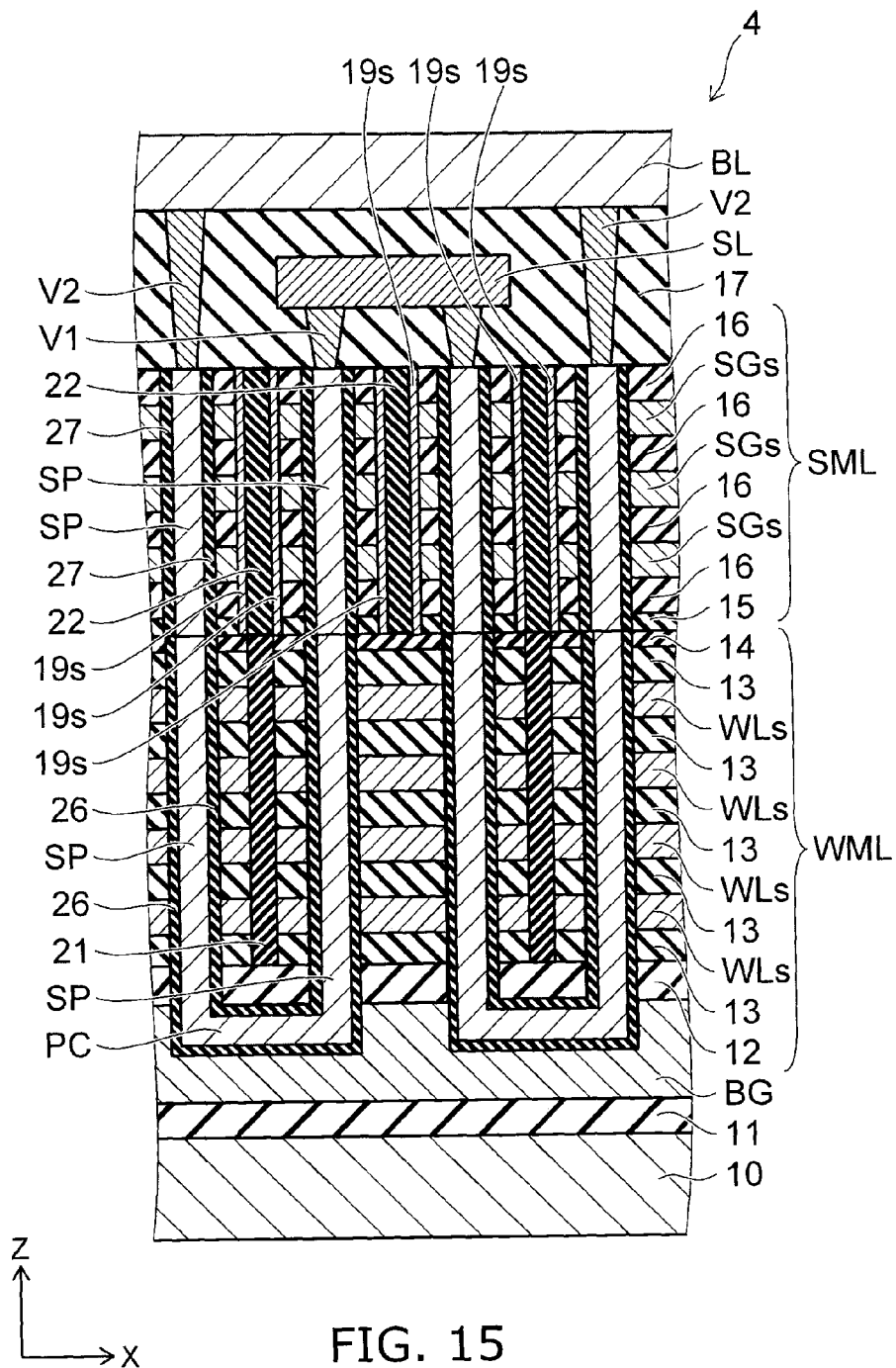
FIG. 15 is a cross-sectional view illustrating an integrated circuit device according to a fourth embodiment.

FIG. 15 is a cross-sectional view illustrating an integrated circuit device according to the embodiment.

FIG. 15 shows the select gate electrode films and their surroundings of the integrated circuit device.

As shown in FIG. 15, the integrated circuit device 4 according to the embodiment differs from the integrated circuit device 1 according to the first embodiment (refer to FIG. 2) in that control gate electrode films WLs, select gate electrode films SGs, and spacer films 19s that are made of metal silicide are provided instead of the control gate electrode films WL, the select gate electrode films SG, and the spacer films 19 that are made of polysilicon. The metal silicide is, for example, nickel silicide or cobalt silicide.

Next, a method of manufacturing the integrated circuit device according to the embodiment will be described.

Figure 16:
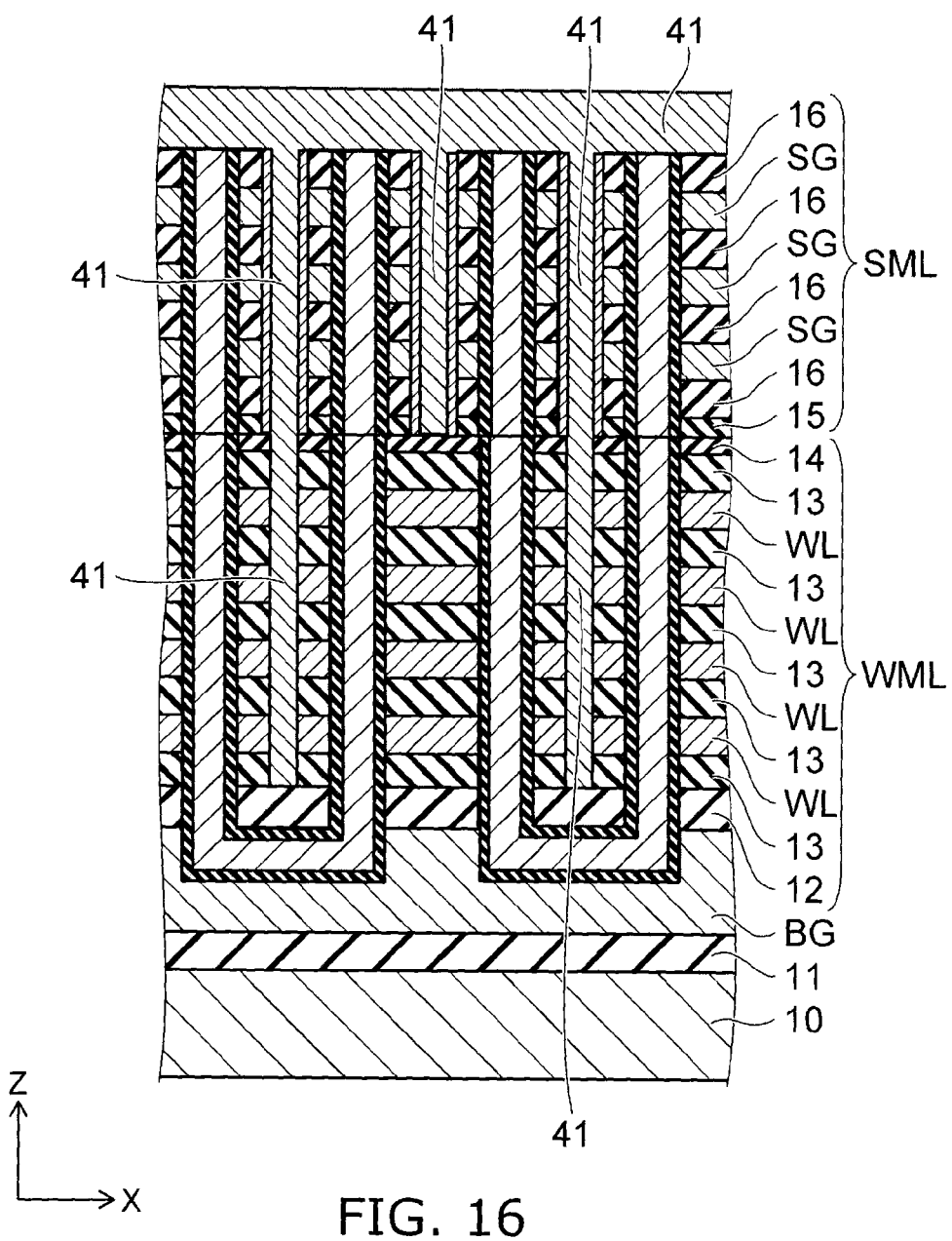
FIG. 16 is a process cross-sectional view illustrating a method of manufacturing the integrated circuit device according to the fourth embodiment.

FIG. 16 is a process cross-sectional view illustrating the method of manufacturing the integrated circuit device according to the embodiment.

First, the processes shown in FIG. 4A to FIG. 9 are carried out. At this stage, the control gate electrode film WL, the select gate electrode film SG, and the spacer film 19 are formed of silicon.

Next, as shown in FIG. 10, RIE is applied to thereby remove the spacer film 19 from the bottom surface of the slit ST2. Next, wet etching is applied to thereby remove the sacrificial member 33 from the slit ST1 formed in the control gate stacked body WML. For example, when the sacrificial member 33 is formed of silicon nitride, phosphoric acid can be used as an etchant.

Next, as shown in FIG. 16, metal, for example, nickel (Ni) or cobalt (Co) is deposited to form a metal film 41 on the entire surface. The metal film 41 is embedded also in the interiors of the slits ST2 and ST1.

Next, as shown in FIG. 15, heat treatment is applied to react the metal contained in the metal film 41 with the silicon contained in the control gate electrode film WL, the spacer film 19, and the select gate electrode film SG for silicidation. Due to this, the control gate electrode film WL, the spacer film 19, and the select gate electrode film SG that are made of silicon are changed to the control gate electrode film WLs, the spacer film 19s, and the select gate electrode film SGs that are made of metal silicide. Thereafter, an unreacted metal film 41 (refer to FIG. 16) is removed.

Next, the processes shown in FIG. 11 and FIG. 1 are carried out. Due to this, the integrated circuit device 4 according to the embodiment is manufactured.

Next, advantageous effects of the embodiment will be described.

In the embodiment, since the control gate electrode film WLs, the select gate electrode film SGs, and the spacer film 19s are formed of metal silicide, the interconnection resistances of these electrode films are low. For this reason, a signal transmission rate is high in the control gate electrode film WLs and the select gate electrode film SGs, so that the operating speed of the integrated circuit device 4 is high.

Moreover, the spacer film 19 is formed on the inner surface of the slit ST2 in the process shown in FIG. 10. For this reason, the inter-layer insulating film 16 and the gate insulating film 27 are protected by the spacer film 19 in the wet etching for removing the sacrificial member 33, so that it is possible to prevent the occurrence of defects in the inter-layer insulating film 16 and the gate insulating film 27. As a result, it is possible in the silicide process shown in FIG. 16 to prevent the metal contained in the metal film 41 from reaching the silicon pillar SP through the defects in the inter-layer insulating film 16 and the gate insulating film 27 to silicide a portion of the silicon pillar SP. If the silicon pillar SP is silicided, the select transistor formed at the intersecting portion between the silicon pillar SP and the select gate electrode film SG does not normally operate, making it difficult to cut off a current.

Configurations, manufacturing methods, and advantageous effects of the embodiment other than those described above are similar to those of the first embodiment.

Variation of Fourth Embodiment

Next, a variation of the fourth embodiment will be described.

In an integrated circuit device according to the variation, a distance between the select gate electrode films SG in the Z-direction is shorter than a distance between the control gate electrode films WL. Moreover, the spacer film 19s is formed integrally with the select gate electrode films SG.

In a method of manufacturing the integrated circuit device according to the variation, the processes shown in FIG. 4A to FIG. 6 are first carried out to form the select gate stacked body SML on the control gate stacked body WML. At this time, the inter-layer insulating film 16 in the select gate stacked body SML is formed to be thinner than the inter-layer insulating film 13 in the control gate stacked body WML. Due to this, the distance between the select gate electrode films SG in the Z-direction is shorter than the distance between the control gate electrode films WL.

Next, the processes shown in FIG. 7 and FIG. 8 are carried out to form the slits ST2 in the select gate stacked body SML. Next, the metal film 41 (refer to FIG. 16) is deposited without forming the spacer film 19. Then, heat treatment is applied to silicide the control gate electrode films WL and the select gate electrode films SG. At this time, the select gate electrode films SG expand in volume as they are silicided, and the expanded portions move into the slit ST2. Due to this, edges of the select gate electrode films SG next to each other in the Z-direction are connected to each other in the slit ST2 to form the spacer film 19s. As a result, the plurality of select gate electrode films SG arranged along the Z-direction are short-circuited to each other through the spacer film 19s. The control gate electrode films WL also expand in volume as they are silicided, but the control gate electrode films WL are not short-circuited to each other because the distance between the control gate electrode films WL in the Z-direction is longer than the distance between the select gate electrode films SG.

According to the variation, the process of forming the spacer film 19 can be omitted compared to the fourth embodiment. For this reason, the productivity of the integrated circuit device can be improved. Configurations, manufacturing methods, and advantageous effects of the variation other than those described above are similar to those of the fourth embodiment.

Fifth Embodiment

Next, a fifth embodiment will be described.

Figure 17:
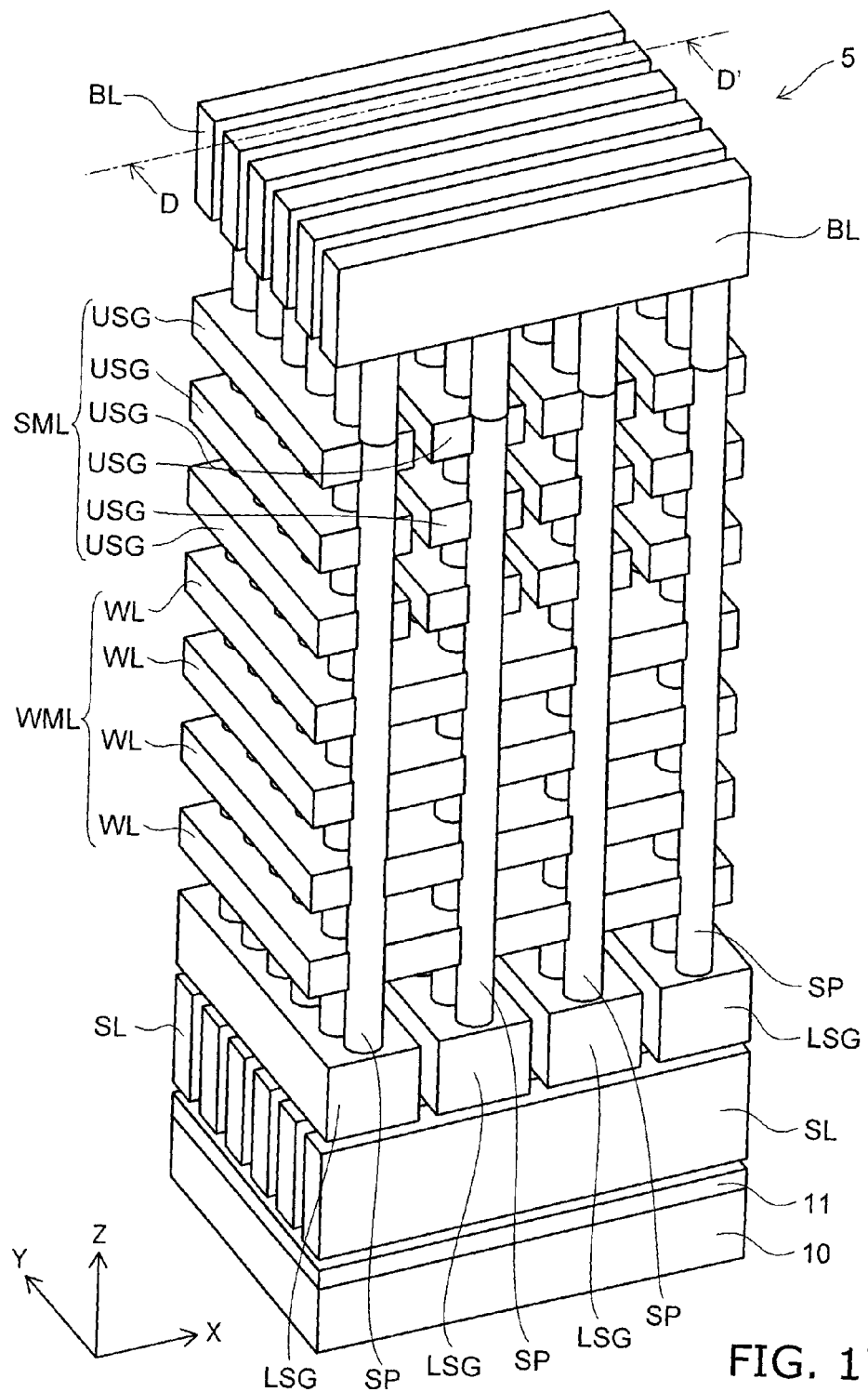
FIG. 17 is a perspective view illustrating an integrated circuit device according to a fifth embodiment.

FIG. 17 is a perspective view illustrating an integrated circuit device according to the embodiment.

Figure 18:
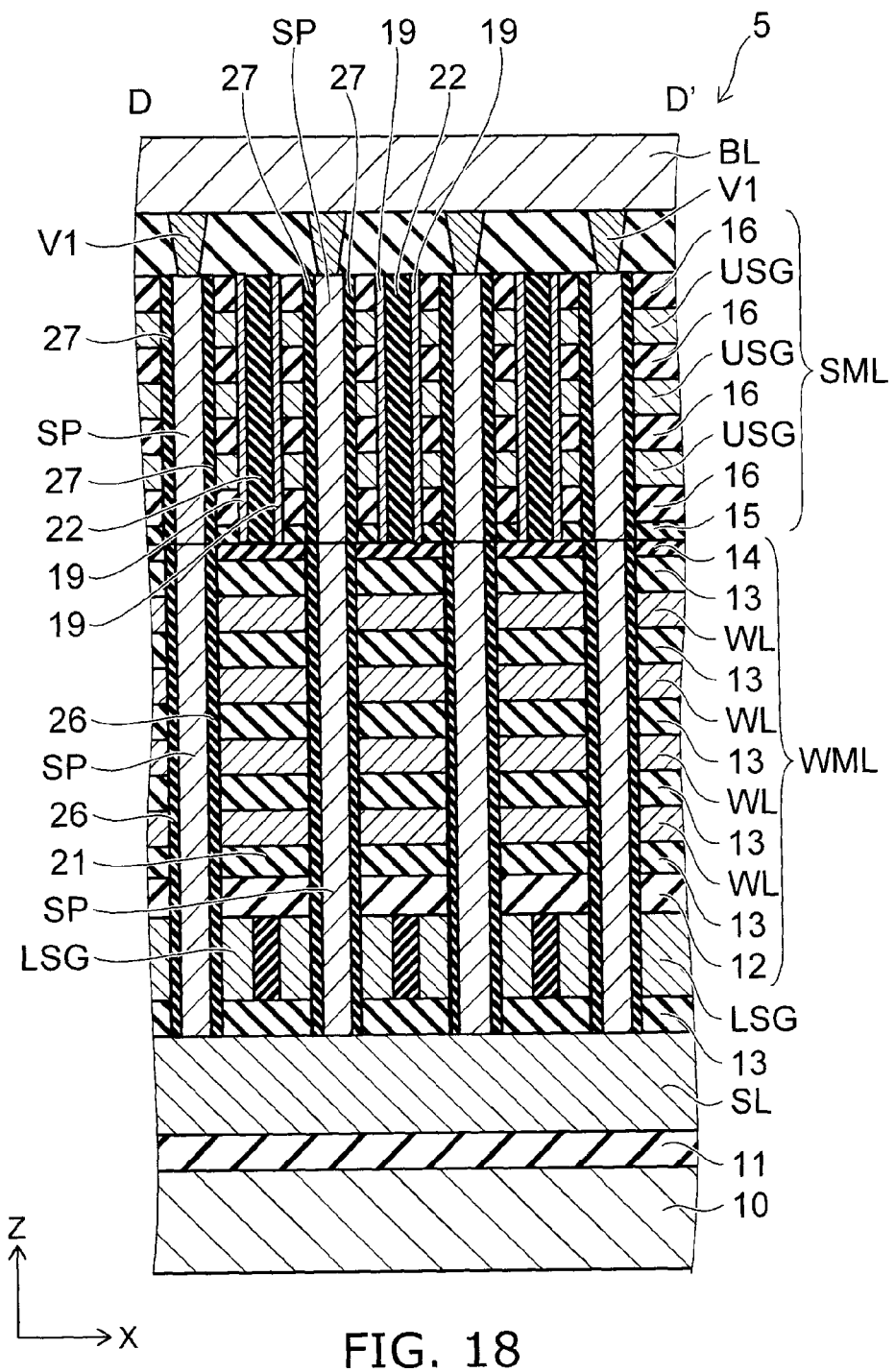
FIG. 18 is a cross-sectional view taken along the line D-D' in FIG. 17.

FIG. 18 is a cross-sectional view taken along the line D-D' in FIG. 17.

As shown in FIG. 1 and FIG. 2, a so-called "U-shaped" device has been described in the first embodiment. That is, in the integrated circuit device 1 according to the first embodiment, the source line SL and the bit line BL are both disposed above the control gate stacked body WML, and the lower ends of two silicon pillars SP are connected to each other by means of the pipe connector PC.

In contrast, in the embodiment as shown in FIG. 17 and FIG. 18, a so-called "I-shaped" device will be described. That is, in the integrated circuit device 5 according to the embodiment, the source lines SL are provided below the control gate stacked body WML, and a single layer of lower select gate electrode films LSG is provided between the source lines SL and the control gate stacked body WML. Moreover, a plurality of layers of upper select gate electrode films USG are provided between the bit lines BL and the control gate stacked body WML. For example, the source line SL and the bit line BL extend in the X-direction, and the lower select gate electrode film LSG and the upper select gate electrode film USG extend in the Y-direction. Further, the control gate electrode film WL is not divided, and has a plate-like shape extending in the XY plane.

The spacer film 19 is provided on side surfaces of the upper select gate electrode films USG. That is, width-direction (X-direction) edges of the plurality of select gate electrode films SG arranged along the Z-direction are connected to each other through the conductive spacer film 19 extending in the YZ plane. In FIG. 17, the spacer films 19 are omitted for convenience of illustration.

Configurations, manufacturing methods, and advantageous effects of the embodiment other than those described above are similar to those of the first embodiment.

According to the embodiments described above, it is possible to realize the integrated circuit device having a high operating speed and the manufacturing method thereof.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. An integrated circuit device comprising:
   a plurality of first electrode films stacked spaced from each other;
   a plurality of second electrode films stacked spaced from each other, on the plurality of first electrode films, and extending in one direction;
   a semiconductor pillar penetrating the first electrode films and the second electrode films;
   a memory film provided between the first electrode films and the semiconductor pillar and capable of storing charge;
   a gate insulating film provided between the second electrode films and the semiconductor pillar; and
   a spacer film electrically connecting width-direction edges of the plurality of second electrode films to each other.

2. The device according to claim 1, wherein the spacer film extends along a plane including the one direction and a stacking direction of the plurality of second electrode films.

3. The device according to claim 1, wherein the spacer film connects respective ones of both width-direction edges of the plurality of second electrode films to each other.

4. The device according to claim 1, further comprising a via penetrating the plurality of second electrode films and connecting the plurality of second electrode films to each other.

5. The device according to claim 1, wherein the spacer film contains metal silicide.

6. The device according to claim 1, wherein the spacer film is conductive and contains silicon.

7. The device according to claim 1, further comprising another spacer film whose composition is different from a composition of the spacer film.

8. The device according to claim 7, wherein the another spacer film is insulative.

9. The device according to claim 8, wherein the another spacer film contains aluminum oxide.

10. The device according to claim 9, wherein the spacer film is conductive and contains silicon.

* * * * *